(12) United States Patent
Choi

(10) Patent No.: US 7,110,204 B2
(45) Date of Patent: Sep. 19, 2006

(54) PROCESS-INSENSITIVE WRITE CURRENT GENERATION FOR A HDD PREAMPLIFIER WRITER EQUIPPED WITH PARALLEL OUTPUT RESISTIVE DAMPING

(75) Inventor: Davy H. Choi, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/897,245

(22) Filed: Jul. 22, 2004

(65) Prior Publication Data

US 2006/0007572 A1 Jan. 12, 2006

(51) Int. Cl.
G11B 5/02 (2006.01)
G11B 5/09 (2006.01)

(52) U.S. Cl. .................... 360/68; 360/46; 360/66; 360/67; 327/424; 327/110; 327/118

(58) Field of Classification Search .................. None
See application file for complete search history.

(56) References Cited

U.S. PATENT DOCUMENTS

| | | | | |
|---|---|---|---|---|
| 5,869,988 A * | 2/1999 | Jusuf et al. | ........... | 327/110 |
| 5,952,856 A * | 9/1999 | Horiguchi et al. | ........... | 327/110 |
| 6,124,751 A * | 9/2000 | Pidutti | ........... | 327/424 |
| 6,128,146 A * | 10/2000 | Ngo | ........... | 360/46 |
| 6,201,653 B1 * | 3/2001 | Contreras et al. | ........... | 360/46 |
| 6,226,141 B1 * | 5/2001 | Teterud | ........... | 360/68 |
| 6,246,269 B1 * | 6/2001 | Schuler et al. | ........... | 327/110 |
| 6,246,296 B1 * | 6/2001 | Smith | ........... | 332/109 |
| 6,275,092 B1 * | 8/2001 | Maggio et al. | ........... | 327/424 |
| 6,297,919 B1 * | 10/2001 | Pidutti et al. | ........... | 360/46 |
| 6,297,921 B1 * | 10/2001 | Price et al. | ........... | 360/68 |
| 6,347,046 B1 * | 2/2002 | Ono et al. | ........... | 363/132 |
| 6,381,086 B1 * | 4/2002 | Koenig et al. | ........... | 360/68 |
| 6,487,030 B1 * | 11/2002 | Pidutti et al. | ........... | 360/46 |
| 6,496,317 B1 * | 12/2002 | Lacombe | ........... | 360/68 |
| 6,580,575 B1 * | 6/2003 | Rafi et al. | ........... | 360/66 |
| 6,680,809 B1 * | 1/2004 | Malmberg et al. | ........... | 360/68 |
| 6,794,880 B1 * | 9/2004 | Tucker | ........... | 324/511 |
| 6,798,591 B1 * | 9/2004 | Barnett et al. | ........... | 360/46 |
| 6,867,936 B1 * | 3/2005 | Ookuma et al. | ........... | 360/46 |
| 6,882,294 B1 * | 4/2005 | Linder et al. | ........... | 341/154 |
| 6,917,484 B1 * | 7/2005 | Ranmuthu | ........... | 360/46 |
| 2005/0094306 A1 * | 5/2005 | Takeuchi | ........... | 360/68 |

* cited by examiner

*Primary Examiner*—Wayne Young
*Assistant Examiner*—Dismery Mercedes
(74) *Attorney, Agent, or Firm*—J. Dennis Moore; W. James Brady; Frederick J. Telecky, Jr.

(57) ABSTRACT

The present invention achieves technical advantages as an improved Parallel Damping scheme suitable for very-low-supply preamp operation. The improved Parallel Damping Scheme accurately generates a programmable Iw flowing through the write head while compensating for a leakage current path through a Parallel Damping resistor.

3 Claims, 7 Drawing Sheets

PROCESS-INSENSITIVE WRITE CURRENT GENERATION FOR A HDD PREAMPLIFIER WRITER EQUIPPED WITH PARALLEL OUTPUT RESISTIVE DAMPING

FIELD OF THE INVENTION

The present invention is generally related to hard disk drives (HDDs), and more particularly to damping out head current ringing.

BACKGROUND OF THE INVENTION

A writer in a hard disk drive (HDD) preamplifier drives an inductive head by passing a write current (Iw) from the writer to the head. Current Iw toggles between +Iw and −Iw values as consecutive one's are written on the disk. If there is impedance mismatch between the writer output and the head, ringing in the Iw waveforms occurs when current Iw is settling after switching state. Customarily, there are two methods of "damping" out the Iw ringing. However, there are pros and cons associated with each method.

Conventional Methods (1) Series Damping (FIG. 1):

Two resistors Rs are added at the output of the "H-bridge" writer. In general, Rs>Rh, where Rh is the write head resistance. For a low CLK signal, transistors M1 and M4 are turned on, and thus current Iw flows in the direction shown in the diagram. Transistors M2 and M3 are turned off during this time. During the next Iw cycle (with a high CLK signal), current Iw flows in the reverse direction.

Pros: If a large VDD is available, Iw=Iwref. In this way, a predictable Iw current value flows through the head because there is only one path for Iw to flow when it goes from transistor M1 to M4.

Cons: Loss of voltage headroom due to the voltage potential developed across the two Rs, given by $\Delta V = 2Rs \ast Iw$. As a result, Iw<Iwref due to channel modulation effect on transistors M5 and M6 caused by reduced Vds. In an extreme case, transistors M5 and M6 enter into triode region of operation. Then, these transistors cease to be true output current mirror devices for MREF; thus, Iw<<Iwref.

(2) Parallel Damping (FIG. 2):

Iw ringing can also be tamed by a resistor Rp placed in parallel with the head. Note that, in general, Rp>>Rh.

Pros: No "additional" voltage drop across the damping resistor Rp.

Cons: Part of current Iw, denoted by current Iw2, now flows through resistor Rp, i.e., current flowing through the head is no longer Iw, but Iw1=Iw−Iw2, where Iw1>>Iw2. To a first order:

$$\frac{Iw2}{Iw1} = \frac{Rh}{Rp} \quad \text{EQ (1)}$$

Note that the current loss of Iw2 is also a function of the silicon wafer process due to inherent process variation of Rp. Because Rp is an internal on-chip resistor, while resistor Rh comes from an external "head" component, the Iw1-to-Iw2 ratio will change with process. As a result, the unpredictability of Iw1 will add uncertainty and cause degradation to the write process.

A schematic of one conventional DAC implementation establishing write current Iw is shown in FIG. 3.

SUMMARY OF THE INVENTION

The present invention achieves technical advantages as an improved Parallel Damping scheme suitable for very-low-supply preamp operation. The improved Parallel Damping Scheme accurately generates a programmable Iw flowing through the write head while compensating for a leakage current path through a Parallel Damping resistor.

DETAILED DESCRIPTION OF THE PREFERRED EMBODIMENT

The Case for Parallel Damping

For a high-end preamp design where a total supply voltage of 10 V is available to operate the writer, the design can afford to tolerate some loss in voltage drop associated with the Series Damping scheme. For example, 2*Rs could be 60Ω. When the Rs's are coupled with an Iw range of 20 to 60 mA, there can be 1.2V to 3.6V of voltage headroom loss.

However, for low-voltage ultra-portable applications, such as the MicroDrive, the available voltage to the preamp can be as low as 2.7 V. It can be appreciated that any appreciable amount of voltage drop due to Rs will impact the writer performance substantially. Therefore, in a very low supply-voltage environment, the Parallel Damping scheme becomes very attractive. However, the write current flowing through the head has to be predictable and stable for the scheme to become viable.

Figure 4:
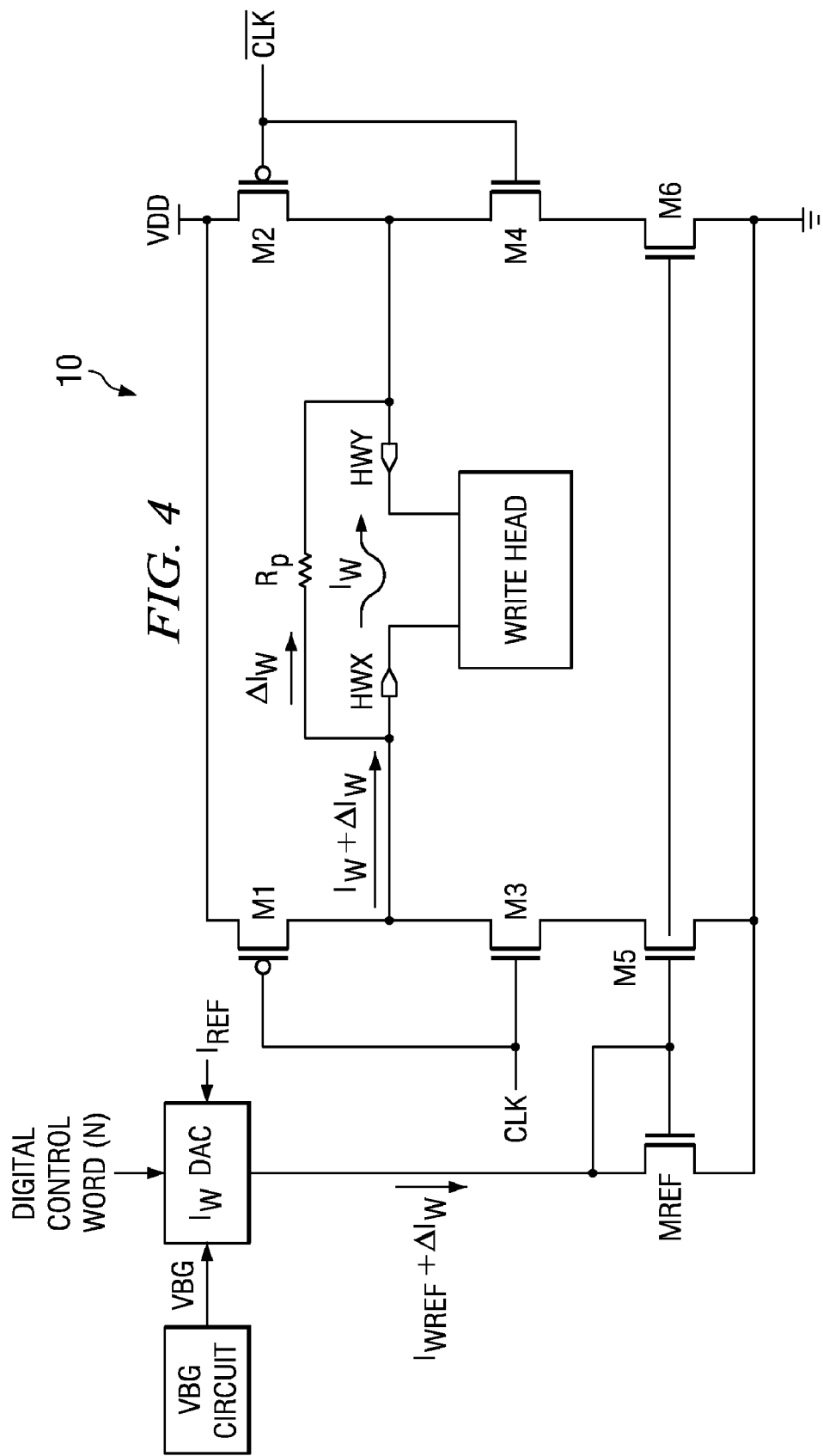
FIG. 4 is a schematic of the present invention including improved parallel damping.

Referring to FIG. 4, there is shown an H-bridge write circuit at 10 according to a preferred embodiment of the present invention. Circuit 10 provides an improved Parallel Damping Scheme including a programmable write current Iw, and at least three (3) advantageous features.

First feature: More current, ΔIw, is injected to the writer to make up for the current loss through resistor Rp. The idea is to force Iw through Rh and ΔIw through Rp.

Second feature: According to EQ (1), with Iw1=Iw and Iw2=ΔIw, ΔIw is scaled with Iw to maintain a constant Rh-to-Rp ratio.

Third feature: According to EQ(1), ΔIw is inversely proportional to Rp to take care of Rp variations due to process changes.

Figure 1:
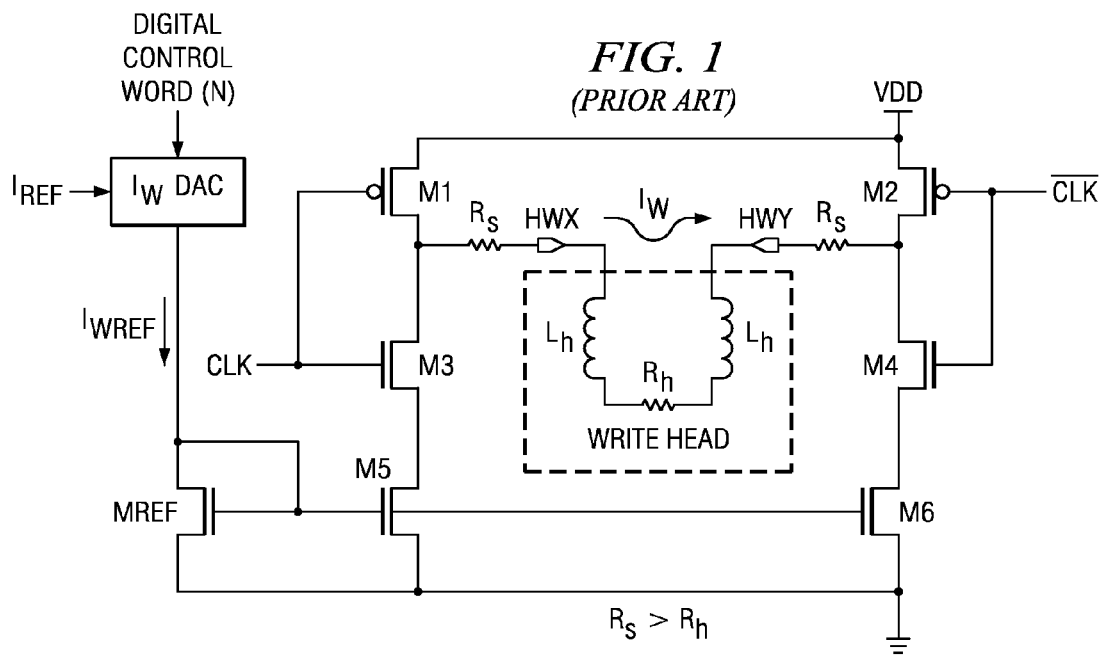
FIG. 1 is a schematic of a prior art H-bridge writer with series damping.
Figure 2:
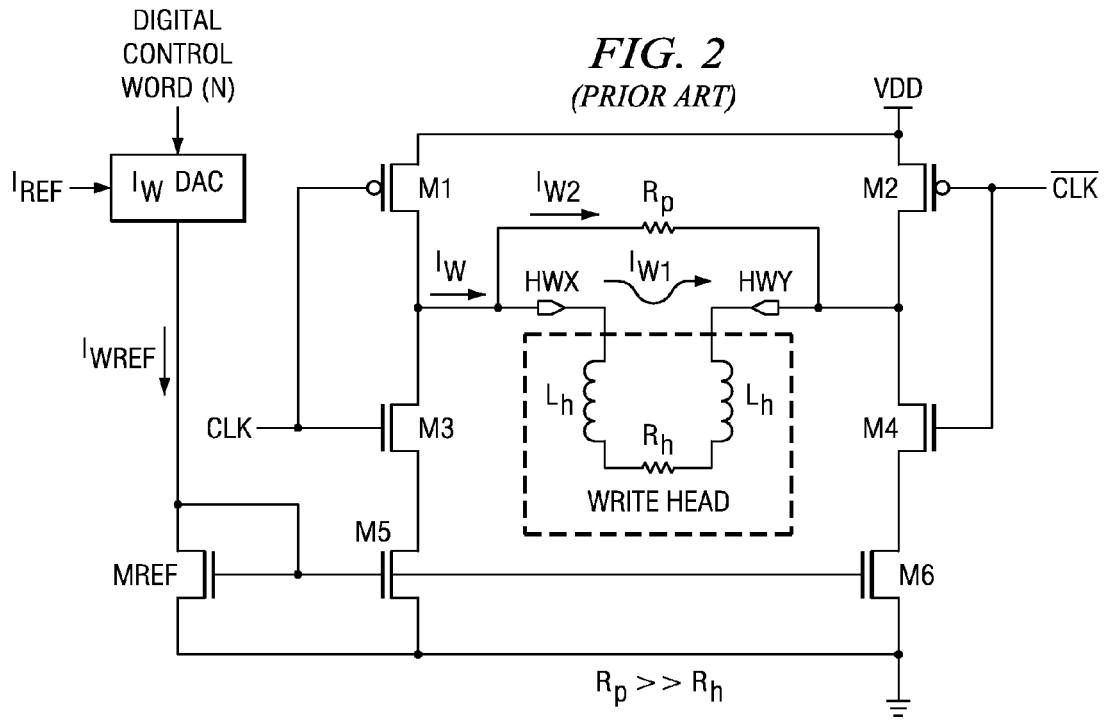
FIG. 2 is a schematic of a prior art H-bridge writer with parallel damping.
Figure 3:
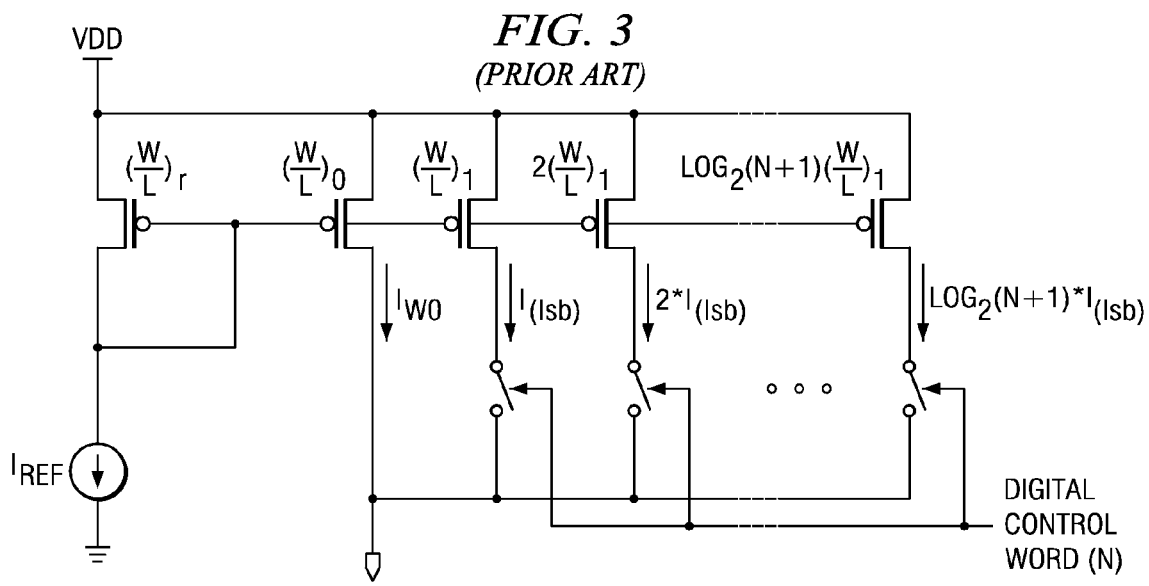
FIG. 3 is a schematic of a prior art DAC implementation of the circuit of FIG. 1.
Figure 5:
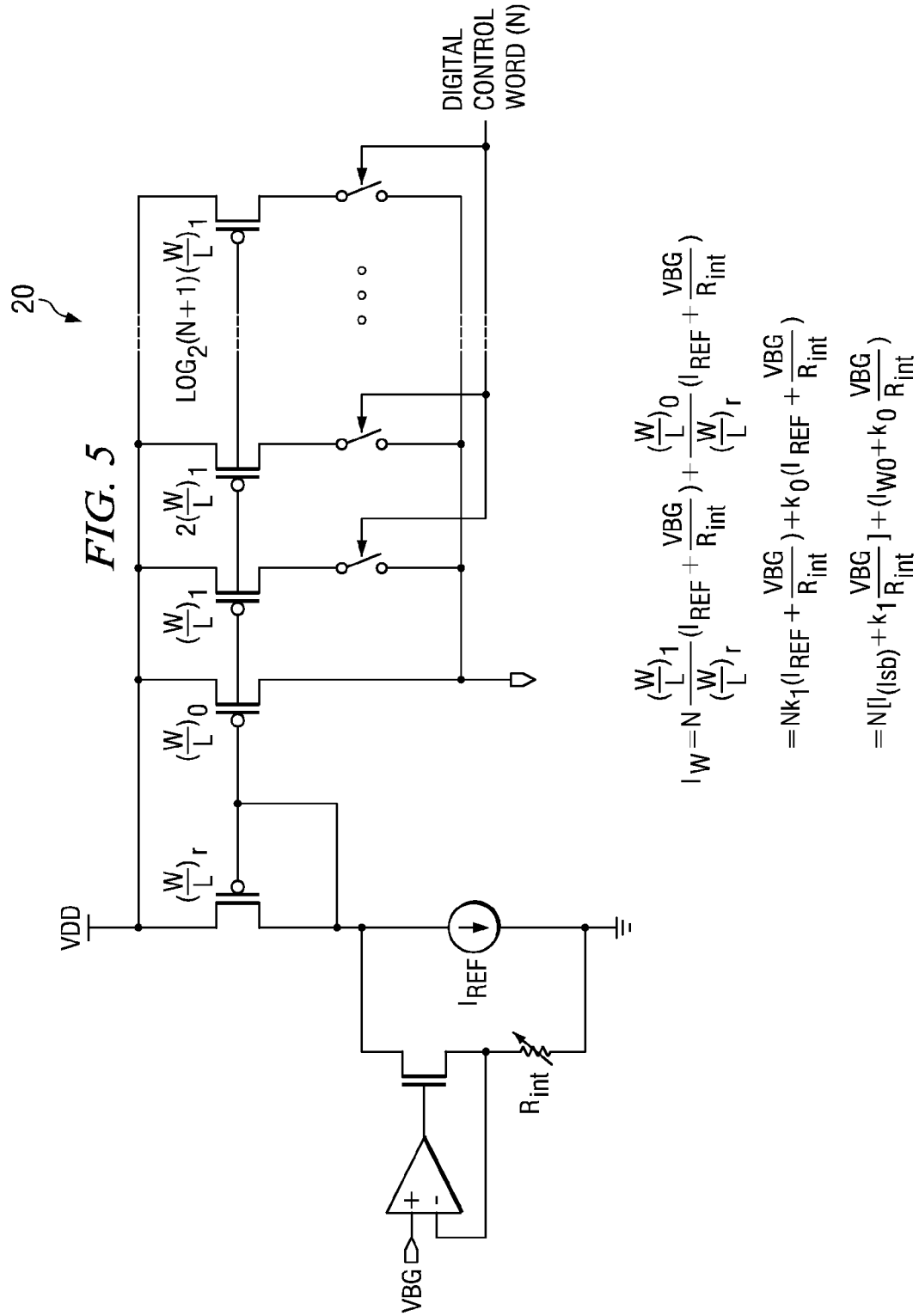
FIG. 5 is a schematic of a DAC implementation of the invention depicted in FIG. 4.

According to one preferred embodiment, as shown in FIG. 5, the programmable Iw is obtained by feeding the output of a current digital-to-analog converter (DAC) to the H-bridge writer circuit 10 such that $$Iw(old) = N*I(lsb) + Iwo \quad \text{EQ(2)}$$

where I(lsb) is the Iw least significant bit (of the binary DAC code; hereinafter, "LSB") current, N is the decimal equivalent of the binary DAC code, and Iwo is the "residue" Iw independent of DAC code. Both I (lsb) and Iwo are derived from the IREF such as shown in FIGS. 1–3. Note that Iw scales with N.

According to the present invention, the Iw DAC equation is modified to be:

$$Iw(new) = N*\left(I(1sb) + k1*\frac{VBG}{Rint}\right) + \left(Iw0 + k0*\frac{VBG}{Rint}\right) \quad \text{EQ (3)}$$

where VBG is a process-insensitive voltage derived from a Bandgap Voltage Reference, Rint is an on-chip resistor of the same type as Rp, and k0=Iw0/IREF and k1=I(lsb)/IREF are fixed ratios of device W/L's. EQ(3) can be re-written as follows:

$$Iw(new) = Iw(old) + \Delta Iw \quad \text{EQ (4)}$$

where:

$$\Delta Iw = (N*k1 + k0)*\frac{VBG}{Rint} \quad \text{EQ (5)}$$

It can be seen that more write current is fed into Rh//Rp in the improved design of FIGS. 4 and 5. This is true for both N=0 and finite N cases. Thus, RHS of EQ (5) contains the term (N*k1+k0) to ensure additional write current for all valid N values. In conclusion, EQ (5) gives an ΔIw providing the three features.

FIG. 5 shows a modified DAC circuit 20 providing Iw(new) according to the present invention providing the improved parallel damping scheme. From now on, the improved scheme will be referred to as "Parallel Damping with Iw Correction."

In FIG. 5, Rint is also shown as a variable resistor to allow for fine tuning of its value to account for different Rh value. The programmable Rint can easily be implemented as a digitally-controlled programmable resistor array.

One negative aspect of the improved scheme of FIG. 4 is more power dissipation when compared to a Parallel Damping scheme without Iw Correction.

Figure 6:
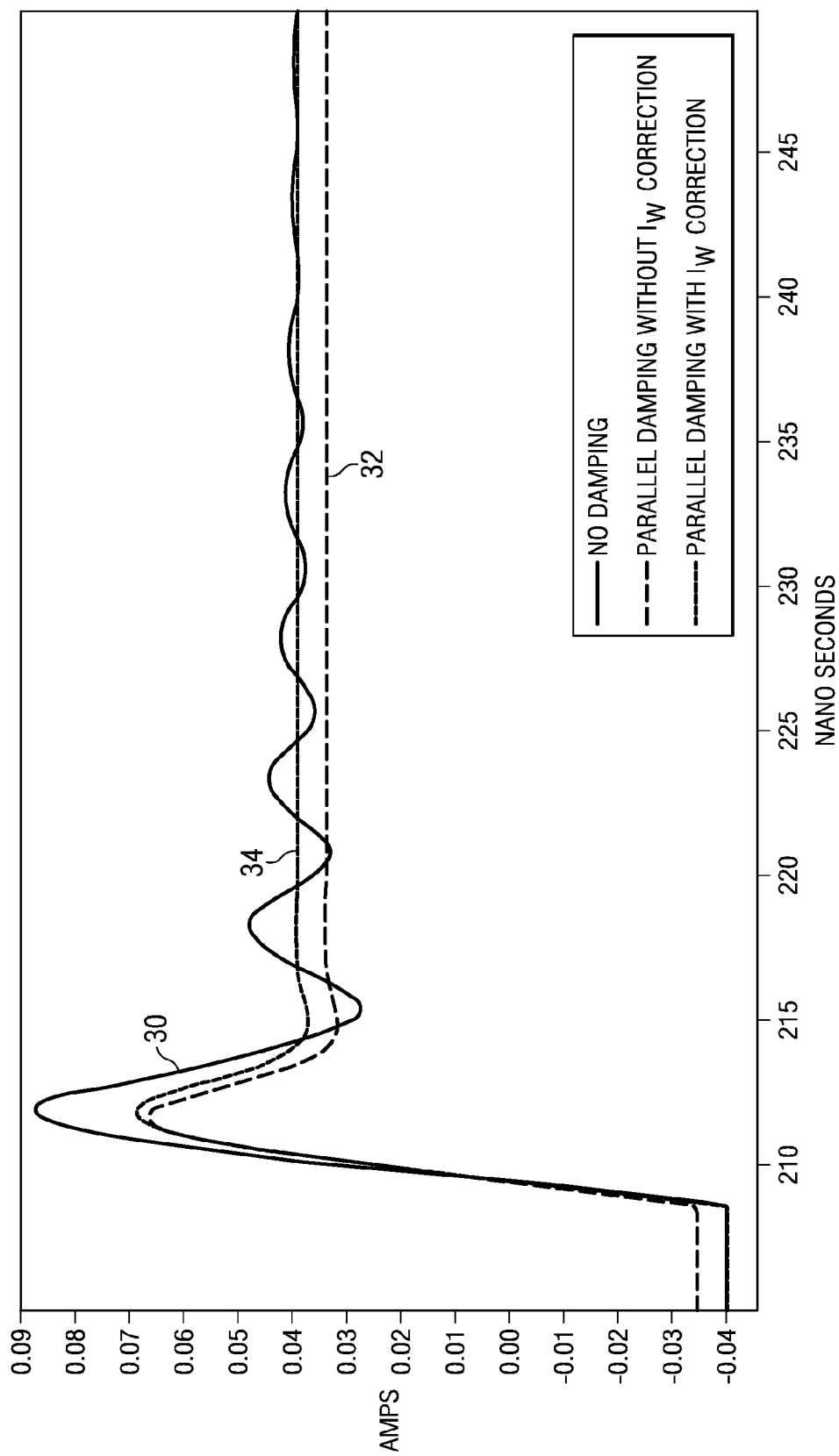
FIG. 6 is a graph depicting the Iw waveform of the present invention compared to the Iw waveform of the prior art approaches of a No Damping case and of FIG. 2.

SIMULATION RESULTS: A prior-art writer with Current Boost was set up. The writer was loaded with Rh=10Ω and Lh of 30 nH. Rp=60Ω in this example. FIG. 6 shows three Iw waveforms: i) No damping at 30; ii) Prior-art Parallel Damping at 32; and iii) Improved Parallel Damping of the present invention, shown at 34. Note that the "Parallel Damping with Iw Correction" waveform 34 restores the current loss due to the parallel Rp path.

Figure 7:
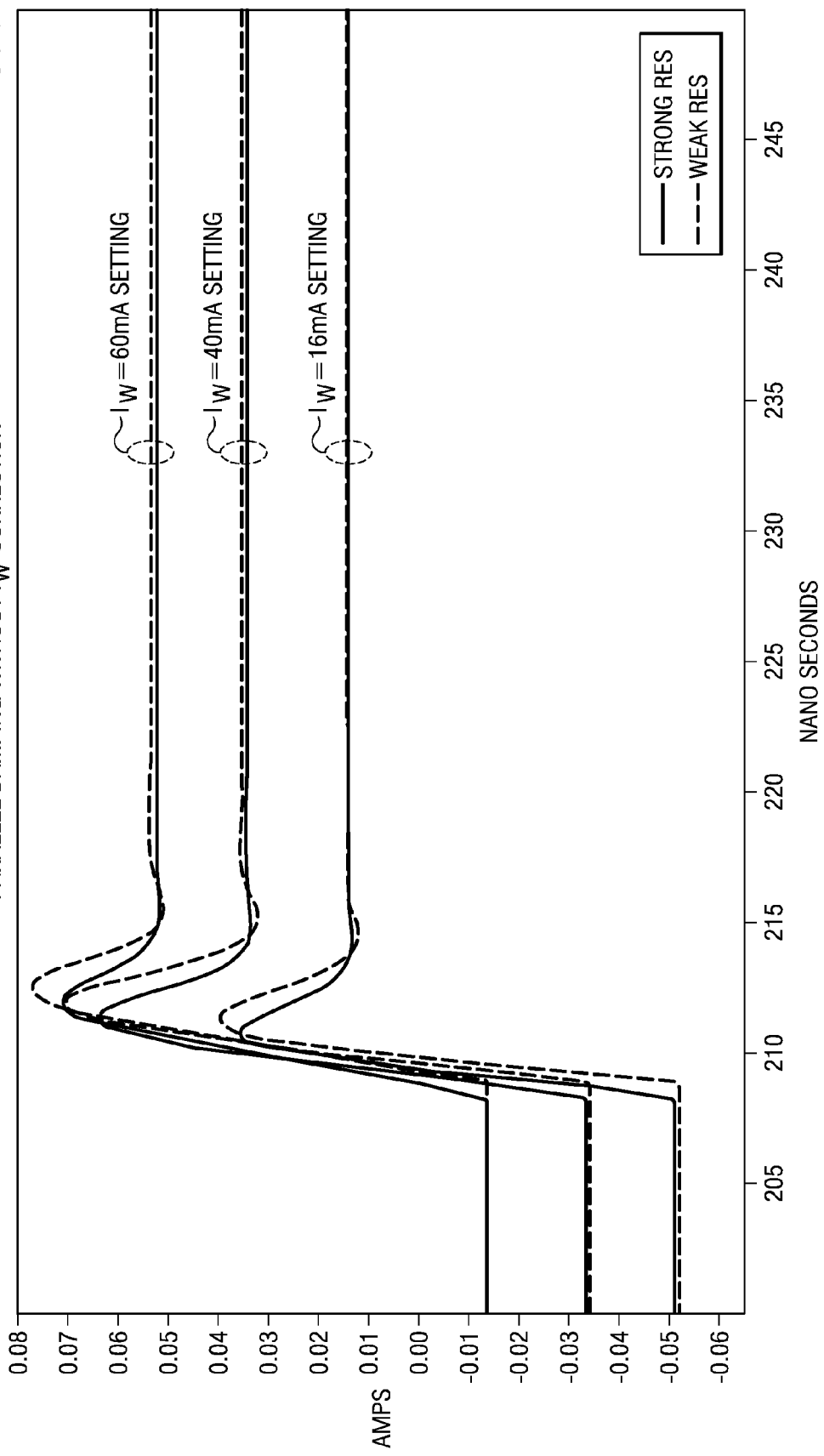
FIG. 7 is a graph the prior art parallel damping approach for different currents Iw and for two extreme resistor Rint process variations.

Three different Iw settings with resistor process variations have been simulated. FIG. 7 shows the case for Parallel Damping w/o Iw Correction, while FIG. 8 shows the case for Parallel Damping with Iw Correction according to the present invention.

Figure 8:
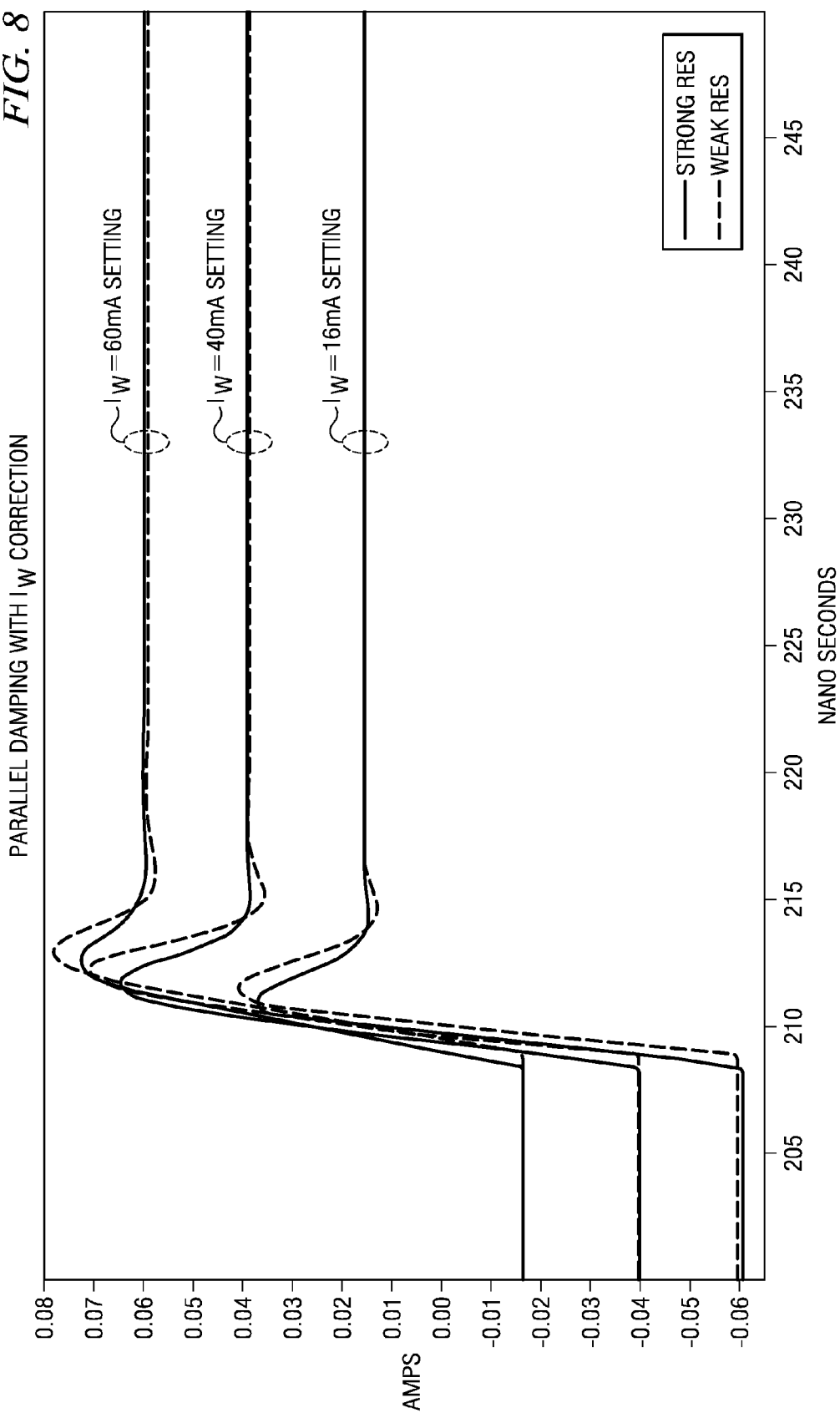
FIG. 8 is a graph depicting the current Iw according to the present invention for different currents Iw and for two extreme resistor Rint process variations.

For FIGS. 7 and 8, the target Iw settings are 59.9, 39.5 and 15.9 mA. As can be seen, the resultant Iw values are much closer to the targets as shown in FIG. 8 versus FIG. 7. As expected, Iw variations due to resistor process change are narrower in FIG. 8, especially so for higher Iw settings. Table 1 shows steady-state Iw values for three Iw settings and two resistor process conditions.

TABLE 1

| Iw Setting | Resistor Process Condition | Parallel Damping without Iw Correction | Parallel Damping with Iw Correction |
|---|---|---|---|
| Iw = 59.9 mA | Strong | 50.85 mA | 60.07 mA |
|  | Weak | 52.05 mA | 59.25 mA |
| Iw = 39.5 mA | Strong | 33.45 mA | 39.46 mA |
|  | Weak | 34.24 mA | 38.93 mA |
| Iw = 15.9 mA | Strong | 13.38 mA | 15.74 mA |
|  | Weak | 13.70 mA | 15.53 mA |

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A circuit, comprising:
   an H-bridge writer adapted to provide a write current Iw, including a head current Iw1 to a hard disk drive head, the head having a resistance Rh, and a current Iw2 to a damping resistor Rp in parallel with the head, wherein Iw=Iw1+Iw2, such that the head current Iw1 is the same as the current that would flow to the head if the parallel resistor Rp were not connected to the head, wherein the writer includes a Digital-to-Analog Converter (DAC) having a binary DAC code represented as N and providing current Iw, the DAC receiving a reference current $I_{REF}$, providing a LSB current of I (lsb) and a residue current Iwo,Iw=N*I(lsb)+Iwo, and the writer is formed on an integrated circuit (IC), and wherein the writer has an on-chip resistor (Rint) of the same type as parallel resistor Rp, and a bandgap voltage reference (VBG).

2. The circuit as specified in claim 1 wherein the current Iw2 is:

$$Iw2 = (N*k1 + k0)*\frac{VBG}{Rint}$$

Where N is the decimal equivalent of the binary DAC code;
K0=Iw0/$I_{REF}$
K1=I(lsb)/$I_{REF}$.

3. The circuit as specified in claim 1 VBG is a process insensitive voltage.

* * * * *